US009659706B2

(12) United States Patent
Qiu et al.

(10) Patent No.: US 9,659,706 B2
(45) Date of Patent: May 23, 2017

(54) METHODS FOR MAKING RADIALLY ANISOTROPIC THIN-FILM MAGNETIC TORROIDAL CORES

(71) Applicant: The Trustees of Dartmouth College, Hanover, NH (US)

(72) Inventors: Jizheng Qiu, West Lebanon, NH (US); Charles R. Sullivan, West Lebanon, NH (US)

(73) Assignee: THE TRUSTEES OF DARTMOUTH COLLEGE, Hanover, NH (US)

( * ) Notice: Subject to any disclaimer, the term of this patent is extended or adjusted under 35 U.S.C. 154(b) by 88 days.

(21) Appl. No.: 14/346,659

(22) PCT Filed: Sep. 24, 2012

(86) PCT No.: PCT/US2012/056910
§ 371 (c)(1),
(2) Date: Mar. 21, 2014

(87) PCT Pub. No.: WO2013/044233
PCT Pub. Date: Mar. 28, 2013

(65) Prior Publication Data
US 2014/0240074 A1    Aug. 28, 2014

Related U.S. Application Data

(60) Provisional application No. 61/538,106, filed on Sep. 22, 2011.

(51) Int. Cl.
H01F 41/02    (2006.01)
H01F 7/02    (2006.01)
(Continued)

(52) U.S. Cl.
CPC .............. H01F 41/02 (2013.01); G11C 19/08 (2013.01); G11C 19/0808 (2013.01);
(Continued)

(58) Field of Classification Search
CPC ... H01F 41/02; H01F 3/02; H01F 7/02; H01F 7/0273; H01F 41/18; C23C 16/458;
(Continued)

(56) References Cited

U.S. PATENT DOCUMENTS 4,999,600 A * 3/1991 Aubert ...................... H01F 7/02
324/318
2003/0005575 A1* 1/2003 Tsuchiya ........... Y10T 29/49078
29/603.07
(Continued)

FOREIGN PATENT DOCUMENTS

JP    6124822 A    5/1994
JP    2006156485 A    6/2006
(Continued)

OTHER PUBLICATIONS

International Search Report and Written Opinion issued in related PCT Patent Application PCT/US2012/056910, dated Mar. 29, 2013, 16 pp.

*Primary Examiner* — A. Dexter Tugbang
(74) *Attorney, Agent, or Firm* — Lathrop & Gage LLP

(57) ABSTRACT

A method of forming a radially anisotropic toroidal magnetic core includes providing apparatus having a first magnet for providing a radial magnetic field extending across a cavity from an axial spindle to a surrounding second magnetic element, placing a substrate in the cavity, the substrate having a hole fitting around the head of the spindle; and sputter-depositing a film of ferromagnetic material onto the substrate. In an embodiment, the spindle is magnetically coupled to a first pole of the first magnet, the second magnetic element is coupled to a second pole of the first magnet, and a thermally conductive, nonmagnetic, insert separates the spindle and the second magnetic element.

10 Claims, 8 Drawing Sheets

(51) Int. Cl.
- *G11C 11/08* (2006.01)
- *G11C 19/08* (2006.01)
- *H01F 41/18* (2006.01)
- *H01F 3/02* (2006.01)
- *C23C 16/458* (2006.01)

(52) U.S. Cl.
CPC ........... *G11C 19/0816* (2013.01); *H01F 3/02* (2013.01); *H01F 7/02* (2013.01); *H01F 7/0273* (2013.01); *H01F 41/18* (2013.01); *C23C 16/458* (2013.01); *C23C 16/4583* (2013.01); *C23C 16/4584* (2013.01); *Y10T 29/49075* (2015.01); *Y10T 29/49076* (2015.01); *Y10T 29/49078* (2015.01)

(58) Field of Classification Search
CPC . C23C 16/4583; C23C 16/4584; G11C 19/08; G11C 19/0808; G11C 19/0816; Y10T 29/49075; Y10T 29/49076; Y10T 29/49078

See application file for complete search history.

(56) References Cited

U.S. PATENT DOCUMENTS

| | | | | |
|---|---|---|---|---|
| 2006/0049044 A1* | 3/2006 | Seddon | ............... | C23C 16/4584 204/298.23 |
| 2008/0138661 A1* | 6/2008 | Lim | .................. | G11C 19/0808 428/827 |

FOREIGN PATENT DOCUMENTS

| | | | |
|---|---|---|---|
| JP | 2007215342 A | * | 8/2007 |
| JP | 2010165958 A | | 7/2010 |

* cited by examiner

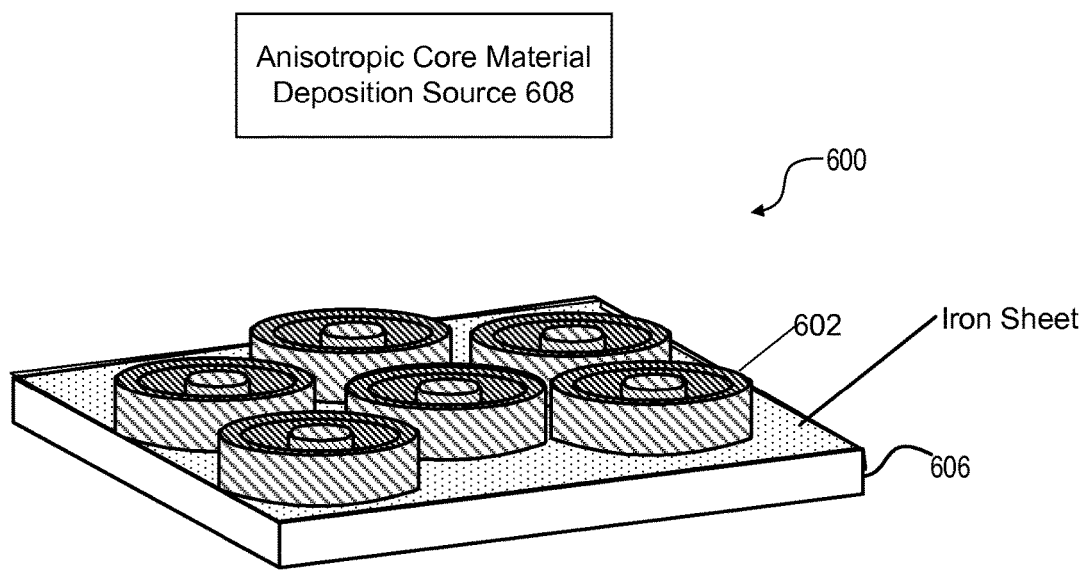
FIG. 6
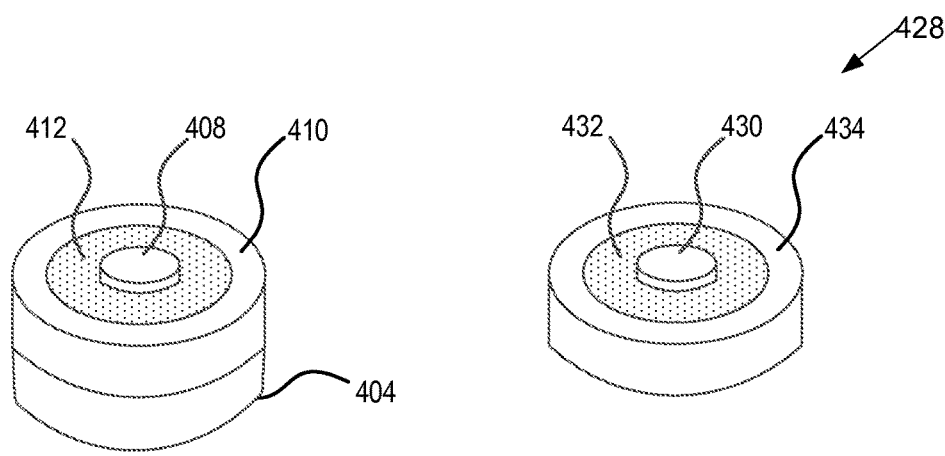
FIG. 7  FIG. 7A

METHODS FOR MAKING RADIALLY ANISOTROPIC THIN-FILM MAGNETIC TORROIDAL CORES

RELATED APPLICATIONS

This application is the U.S. national stage of international application PCT/US2012/056910, filed Sep. 24, 2012, which claims priority to U.S. Provisional Application 61/538,106 filed Sep. 22, 2011, the disclosures of which are incorporated herein by reference.

U.S. GOVERNMENT RIGHTS

The invention was made with Government support under Department of Energy Grant No. 505904. The Government may have certain rights in this invention.

BACKGROUND

Some magnetic materials have anisotropy—a property whereby the materials are easier to magnetize along one axis, the easy axis, than in another, or hard, axis. Aniostropy is a result of many effects, including crystal structure, orientation of nanostructures of the material, stress and magnetostriction, and typically affects the shape of hysteresis loops, permeability and other magnetic properties of the material. It results in magnetic properties that differ with direction of applied magnetic fields.

Thin-film magnetic materials are attractive for microfabricated very-high-frequency (VHF) power magnetic devices, but their anisotropy makes them difficult to use in toroidal geometries, in which flux direction varies. Toroidal geometries are often attractive for use in power conversion applications because they emit little external magnetic field and, by keeping flux in the plane of the core, help reduce eddy current losses compared to other inductor geometries, such as solenoids and planar spirals. External magnetic fields are typically undesirable because they may cause electromagnetic interference and they may induce eddy-currents in nearby conductors and shielding materials, potentially leading to power losses.

SUMMARY

A method of fabricating a core having a radial aniosotropy, the method including providing an apparatus comprising a first magnet for providing a radial magnetic field extending from an axial spindle of the apparatus to a surrounding second magnetic element, the axial mandrel and the surrounding second magnetic element defining a cavity therebetween, placing a substrate in the cavity, the substrate having a hole, the hole in the substrate fitting around the head of the spindle; and depositing a film of ferromagnetic material onto the substrate.

Apparatus for fabricating a core having radial anisotropy including a magnetic orientation fixture with at least a first magnet for providing a radial magnetic field extending from an axial spindle to a surrounding second magnetic element, the axial spindle and the surrounding second magnetic element defining a cavity, the cavity configured to receive discoidal substrates, the substrates having an axial hole; and deposition apparatus configured for deposition of films of ferromagnetic material on the substrates; wherein the magnetic orientation fixture is configured for placement in a deposition chamber of the deposition apparatus.

A radially anisotropic toroidal magnetic core.

An inductor comprising a coil wound on the radially anisotropic core.

A method of fabricating a core having radial aniosotropy, including fabricating a core of anisotropic material; providing a fixture with a first magnet for providing a radial magnetic field extending from an axial spindle of the fixture to a surrounding second magnetic element; placing the core in a region subject to magnetic fields extending from the spindle to the second magnetic element; and heating the core above a transition temperature of the core to cause the anisotropic magnetic material of the core to become radially anisotropic.

BRIEF DESCRIPTION OF THE DRAWINGS

FIG. 6 shows a perspective view of a number of fixtures, such as the fixtures of FIG. 4, sharing a common plate; in this embodiment, multiple fixtures 602, such as those illustrated in FIG. 3, 4, 7, or 7A, are disposed on a common iron plate taking the place of iron plate 406.

FIG. 7 shows a perspective view of one embodiment of a fixture that may be used on a common plate in a manner similar to that illustrated in FIG. 6.

FIG. 7A illustrates a perspective view of an alternative fixture that may be used on a common plate in a manner similar to that illustrated in FIG. 6.

DETAILED DESCRIPTION OF THE EMBODIMENTS

Many thin-film magnetic materials exhibit strong magnetic anisotropy. Thin-film magnetic materials are attractive for micro-fabricated very-high-frequency magnetics, including inductors and transformers, including power supply magnetics, but traditional deposition techniques lead to a hard axis oriented in the same direction throughout a device. Orientation of the hard axis (and correspondingly the easy axis perpendicular to the hard axis) in a single direction in a plane of a device throughout the device leads to difficulties in toroids since the anisotropy is in a first direction relative to fields within the toroid at one point on the toroid, and perpendicular to that direction at another point.

Figure 1:
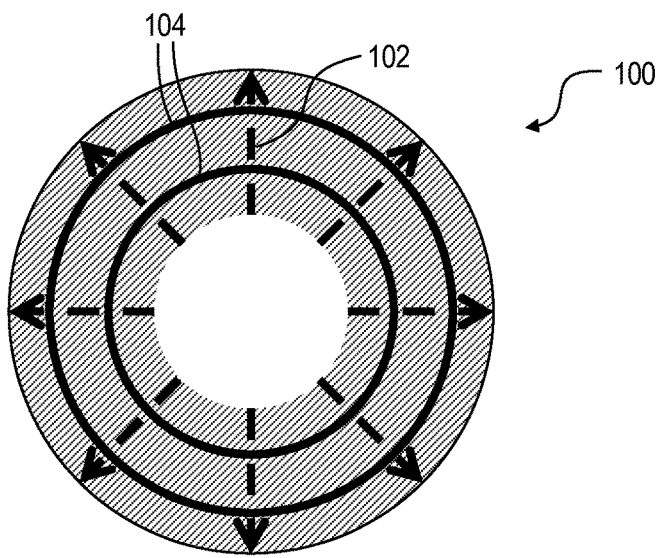
FIG. 1 shows a top plan view of a radial-anisotropic, toroidal magnetic core.

We propose that anisotropy with easy axis oriented radially, and the complementary hard axis oriented circumferentially will provide optimum performance for toroidal inductors. Magnetic materials having anisotropy oriented in this way in a toroidal core are referred to herein as radially-anisotropic materials. Such toroidal cores have a radial easy-axis and a circumferential hard-axis, thereby promoting low hysteretic losses and high inductance of coils wound upon them, since magnetic flux tends to flow in the circumferential direction in a toroidal core. These cores may be used in inductor or transformer applications; typically when the cores are used in such applications one or more turns of an electrical conductor are wound over the core. FIG. 1 shows an example of a radially-anisotropic, toroidal magnetic core 100 having a radial easy-axis 102 and a circumferential hard-axis 104.

A method to deposit nanostructured magnetic film materials with radial anisotropy of the easy axis that improves performance for high-performance toroidal inductors is disclosed herein.

We have discovered that radially-anisotropic, thin-film magnetic cores can be formed by depositing a thin-film magnetic material on a substrate in the presence of a radial magnetic field. It is typically desirable that the radial magnetic field be at least be predominantly parallel to a substrate plane to minimize perpendicular anisotropy. Such systems and methods can be used, for example, to form radial-anisotropic, toroidal magnetic cores.

Figure 3:
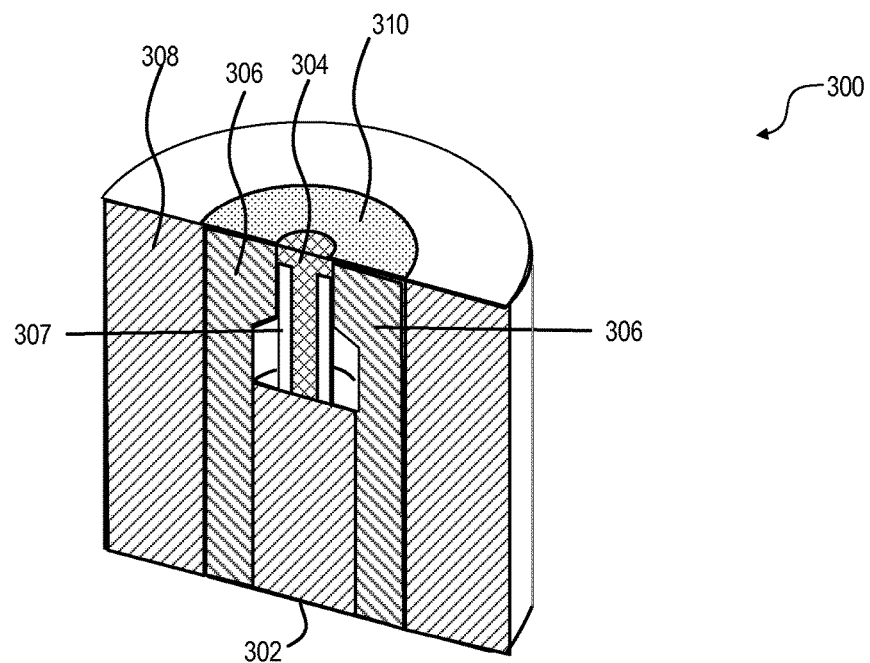
FIG. 3 shows a cross-sectional view one embodiment of a magnetic orientation fixture that may be used, for example, in the method of FIG. 2.

In a particular embodiment, the radial anisotropy is induced during sputter deposition of ferromagnetic cobalt-zirconium-oxide (Co—Zr—O) thin films by an applied radial magnetic field predominantly parallel to the substrate plane. A magnet array and field-directing iron components, illustrated in FIG. 3, are designed to create a radial field predominantly parallel to the substrate plane. Initial prototype toroidal cores fabricated were on the apparatus of FIG. 3 with 8-milimeter inside diameter, 16-milimeter outside diameter, and thickness of 6 micrometers. Hysteresis measurements along the radial direction and the circumferential direction (hard axis) of deposited samples show the desired anisotropy orientation. Small-signal measurements show that the fabricated toroidal core has flat relative permeability from below ten to several hundred megahertz, and these cores may reach a quality factor (Q) higher than 100 at frequencies in the range of tens of megahertz.

Figure 2:
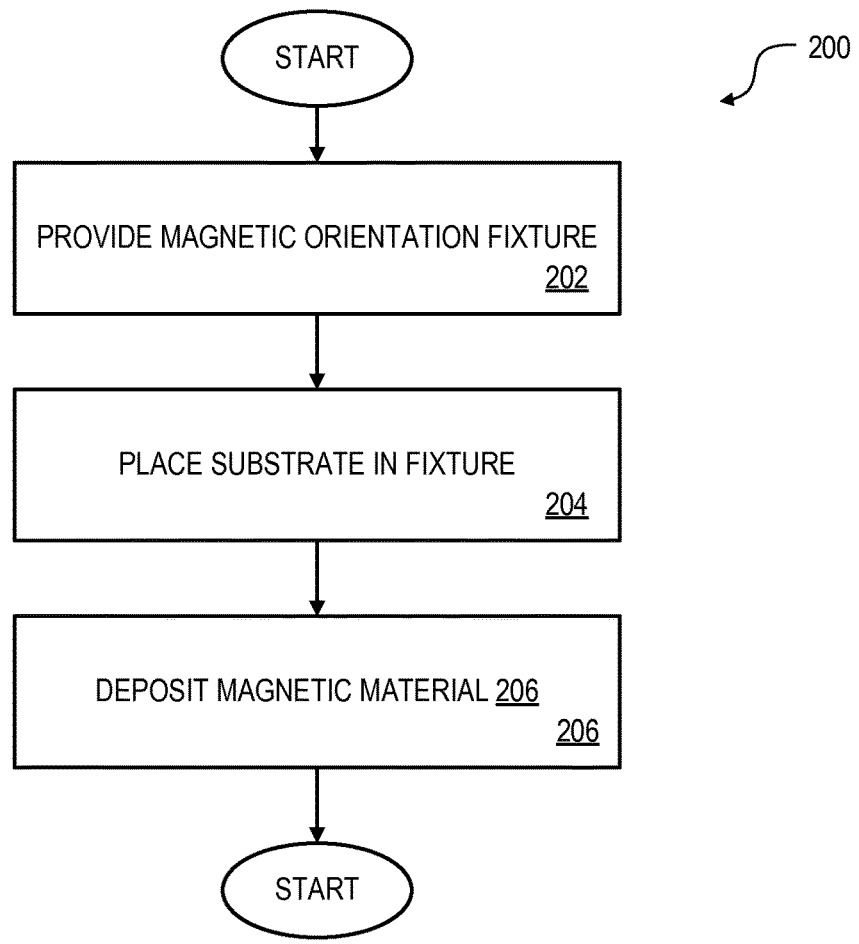
FIG. 2 shows a method for forming a radial-anisotropic thin-film magnetic material, according to an embodiment.

FIG. 2 shows a method 200 for forming a radially-anisotropic, toroidal thin-film magnetic material magnetic core. Method 200 begins with step 202 of providing a magnetic orientation fixture for applying a radial magnetic field. An example of step 202 is providing one of the magnetic orientation fixtures discussed below with respect to FIGS. 3-5. In step 204, a substrate is placed in or on the magnetic orientation fixture. An example of step 204 is placing a substrate 310 (FIG. 3) in the fixture. In step 206, a magnetic material is deposited on the substrate and subjected to a radial magnetic field from the magnetic orientation fixture. For best results, the magnetic orientation fixture should apply a radial magnetic field at least substantially parallel to the substrate's plane. An example of deposition step 206 is sputter depositing thin-film nano-granular magnetic materials, such as Co—Zr—O films, on the substrate.

In alternative embodiments, the deposition step 206 may be performed by electroplating, by physical vapor deposition such as evaporative deposition, or by chemical vapor deposition, as appropriate for the magnetically anisotropic material being deposited.

In an alternative embodiment, a flat sheet of substrate material is placed over one or more fixtures similar to those illustrated in FIGS. 3, 4, 5, 6, 7, and 7A, and magnetic material deposited thereon. In this embodiment, the magnetic material may be deposited with a masking technology to form radially anisotropic cores on the flat sheet. Alternatively, the material may be deposited as a sheet and radially anisotropic cores formed by subsequent etching.

FIG. 3 shows a cross-sectional view of a magnetic orientation fixture 300, which is one possible magnetic orientation fixture that can be used, for example, with method 200 of FIG. 2. Fixture 300 includes a cylindrical center magnet 302, an inner magnetic element 304 disposed above magnet 302, a copper insert 306 surrounding magnet 302 and the intermediate portion of inner magnetic element 304, and a cylindrical outer magnetic element 308 surrounding copper insert 306. In some embodiments, a nonmagnetic spacer 307 may be present to position the inner magnetic element in copper insert 306. Copper insert may be formed in one piece, or as an assembly of multiple subsections. In typical embodiments, magnetic elements 304, 308 are fabricated from iron; in alternative embodiments, elements 304 and 308 are fabricated from other magnetic materials. Magnetic elements 304, 308 are coupled to opposite poles of magnet 302. In certain alternate embodiments, copper insert 306 is replaced with another insert fabricated from a nonmagnetic, thermally-conductive insert suitable for use within the deposition apparatus, such as stainless steel or aluminum.

A toroidal shaped substrate 310, which is formed of polyimide in some embodiments, and in other embodiments formed from silicon or alumina, is placed in fixture 300 on top of copper insert 306, and within a recess or shallow cavity formed by a second magnetic element 308 protruding above a top of copper insert 306. The cavity facilitates alignment of the substrate 310 around the head of spindle or inner magnetic element 304. Substrate 310 has a central hole; the central hole is fitted over central magnetic element, or spindle, 304. Magnetic material is then deposited on substrate 310 to form a toroidal magnetic core, such as described above with step 206 of method 200; deposition may be by sputtering, evaporation, chemical vapor deposition, precipitation, or another deposition technique known in the art of forming films of magnetic materials although sputtering has been used to make prototype cores. Magnet 302 and magnetic elements 304, 308 cooperate to apply a radial magnetic field substantially parallel to substrate 310 to forming and newly deposited magnetic material on substrate 310, and thereby aligns anisotropy of the deposited material to the applied field. Central magnetic element, or spindle, 304 has a T-shaped head having a diameter larger than an intermediate portion disposed between its head and the magnet 302, this T-shaped head helps align magnetic fields between the magnetic elements 304, 308 radially across substrate 310 by concentrating those fields in a region between a rim of the T-shaped head of magnetic element 304 and magnetic element 308. In an embodiment, finite element analysis is used to design precise shape of the magnetic elements, including the T-shaped head.

Figure 4:
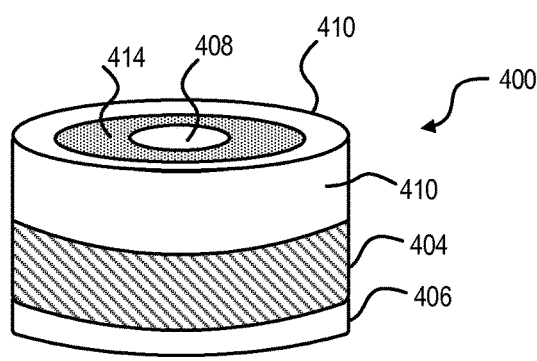
FIG. 4 shows a perspective view of another embodiment of a magnetic orientation fixture that may be used, for example, in the method of FIG. 2.
Figure 5:
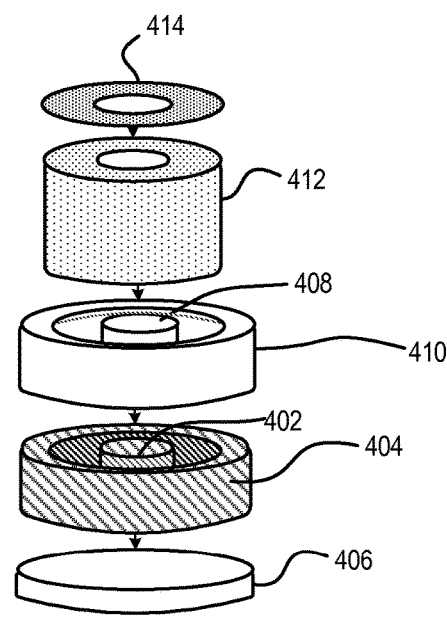
FIG. 5 shows an exploded perspective view of the fixture of FIG. 4.
Figure 8:
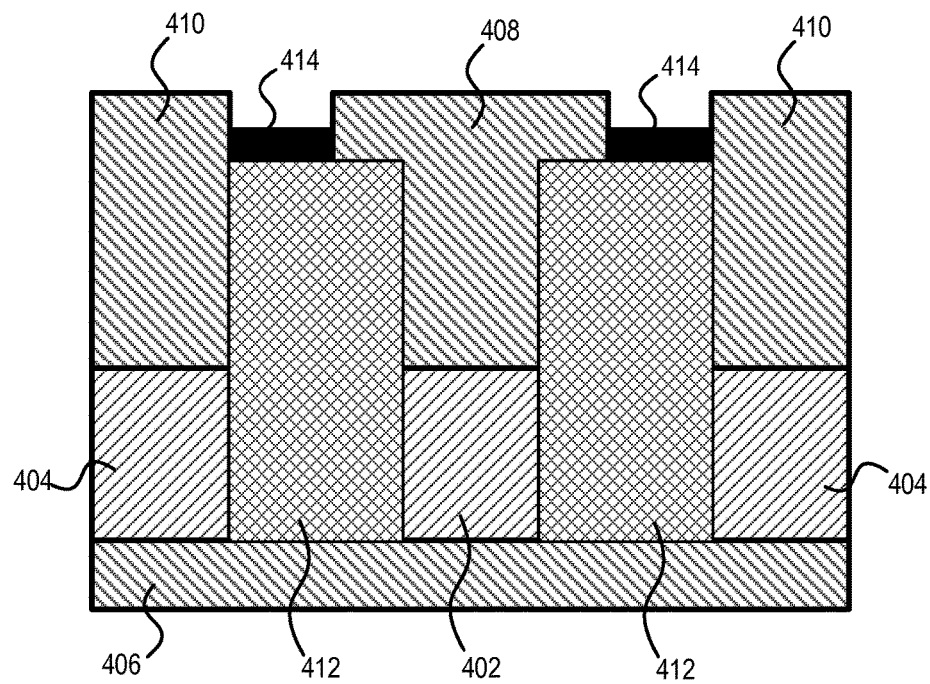
FIG. 8 shows a cross sectional view of one of the fixtures of FIG. 6.

FIG. 4 shows a perspective view of an alternative magnetic orientation fixture 400, which is another possible fixture for inducing magnetic anisotropy in deposited films that can be used, for example, with method 200 of FIG. 2. FIGS. 4 and 5 are best viewed together in the following description. Fixture 400 includes cylindrical inner and outer magnets 402, 404 both disposed on a magnetic plate 406 and having opposite polarity. A cylindrical inner magnetic element, or spindle, 408 is disposed on inner magnet 402, and a cylindrical outer magnetic element 410 is disposed on outer magnet 404. Magnetic plate 406 and inner and outer magnetic elements 408, 410 are formed of iron or another ferromagnetic material. A cylindrical copper insert 412 is disposed on magnetic plate 406, surrounding inner magnet 402 and inner magnetic element 408 and in turn surrounded by outer magnet 404 and element 410. In an alternative embodiment, copper insert 412 may be fabricated from an alternative nonmagnetic, thermally-conductive, material suitable for use within sputtering or other appropriate deposition apparatus. Outer magnet 404 and outer magnetic element 410 each surround copper insert 412. Fixture 400 accepts a toroidal substrate 414, such as a thin disk having a central hole, such as a disk formed of alumina, on top of copper insert 412. Magnetic material is then disposed on substrate 414 by sputtering, or by another appropriate deposition method, such as described above in step 206 of method 200. Magnetic elements 408, 410 help fixture 400 to provide a radial magnetic field substantially parallel to substrate 414 to the magnetic material during its deposition. Inner magnetic element 408 has a T-shaped head having a diameter larger than the intermediate portion disposed between its head and inner magnet 402.

In an alternative embodiment the inner magnetic element and its T-shaped head 304, 408 is formed as a part of inner magnet 402, 302 although working some rare-earth permanent magnet materials can be difficult and nonuniform magnetization of a combined head and magnet may be required for optimum field distribution during core formation.

With reference to FIGS. 3 and 4, it is anticipated that the magnetic orientation fixture may utilize an axial magnet, such as magnet 302, 402 an outer magnet, such as magnet 404, or both, together with one or more ferromagnetic field-forming elements which may be fabricated from soft iron or similar ferromagnetic materials for directing magnetic fields or "lines of magnetic force" provided by the magnet such that a radial magnetic field is provided to a substrate during deposition of core material on the substrate.

While it is anticipated that the magnets that provide the magnetic field, such as magnet 302, 402, 404, are permanent magnets, it is anticipated that electromagnets may provide the magnetic field in alternative embodiments.

A number of magnetic orientation fixtures 300, 400 can share a common magnetic plate 406. For example, FIG. 6 shows an assembly 600 including a number of fixtures 400 sharing a common magnetic plate 606. Similarly, a number of magnetic orientation fixtures 300, 400 may be placed simultaneously into a deposition apparatus for simultaneous deposition of a magnetic core material thereon. Copper inserts 412, substrates 414, and magnetic elements 408, 410 are omitted from FIG. 6 for illustrative clarity. FIG. 7 shows a perspective view of one of the fixtures of FIG. 6 but with copper insert 412 present.

FIG. 7A illustrates an alternative embodiment 428 of the fixture suitable for use where some axial magnetic field is tolerated during deposition. Although this may result in some axial as well as radial anisotropy in cores fabricated using the fixture, these cores may suffice for some applications. In this embodiment, an axial cylindrical magnet 430 is surrounded by a thermally conductive ring 432 and an outer ring magnet 434. The axial magnet 430, conductive ring 432, and outer magnet 434 of each fixture 428 are assembled together on a magnetic plate in a manner similar to that illustrated in FIG. 6.

It is anticipated that magnetic plate 606, 406 may be an iron plate, or a magnetic plate constructed of other ferromagnetic materials capable of concentrating and guiding magnetic fields.

Figure 9:
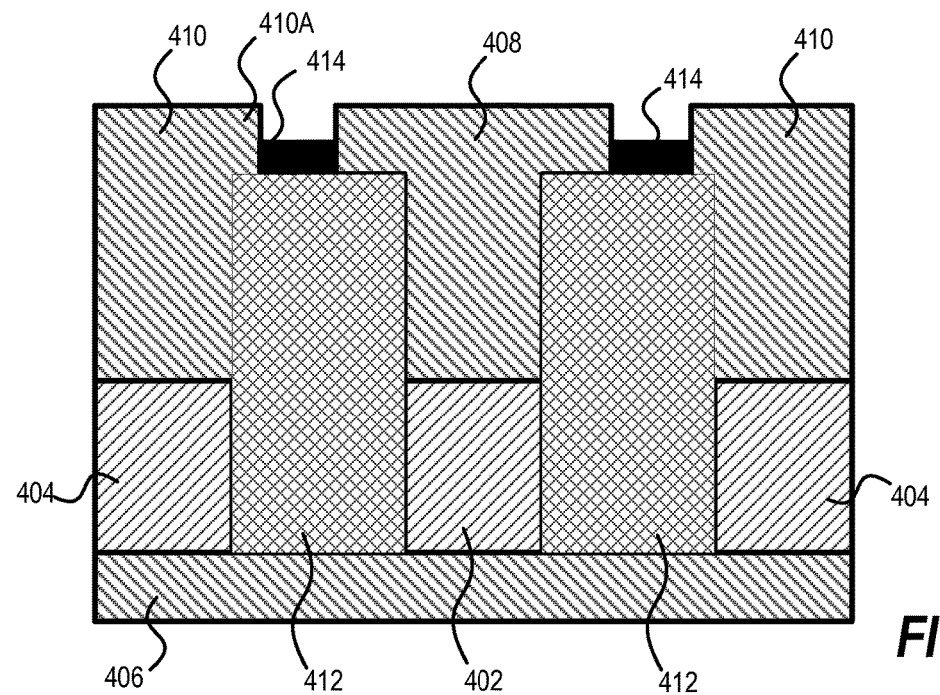
FIG. 9 shows a cross-sectional view of an alternate embodiment of one of the fixtures of FIG. 6.

In an alternative embodiment shown in FIG. 9, cylindrical magnetic element 410 has an inner lip 410A above nonmagnetic element 412. In addition to the T shaped head of inner magnetic element 408, this lip helps concentrate the magnetic field radially between T-shaped head 408 and element 410.

Figure 10:
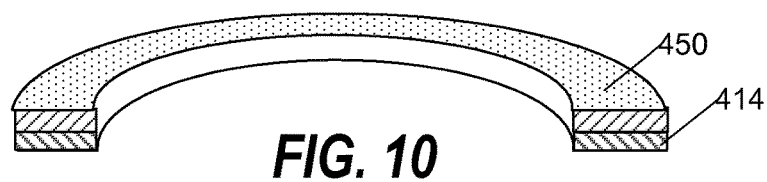
FIG. 10 illustrates a cross-sectional view of the radially-anisotropic, toroidal, magnetic core of FIG. 1.
Figure 11:
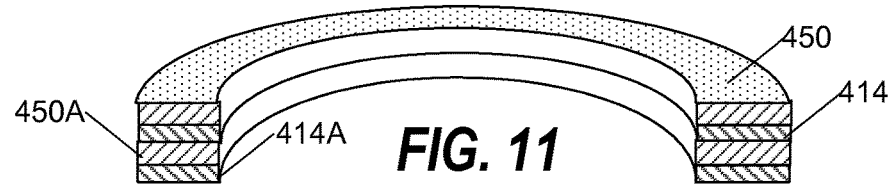
FIG. 11 illustrates a cross-sectional view of a layered magnetic core having multiple layers each resembling the radial-anisotropic, toroidal, magnetic core of FIG. 1.

Once radially anisotropic magnetic material 450 is formed on the substrate 414, this anisotropic material has toroidal shape, with radial anisotropy, as illustrated in top view in FIG. 1, or in cross sectional view in FIG. 10, and an inductor is then formed by providing one or more windings (not shown) of electrically-conductive material wrapping around the core to form an inductor or a transformer. Should a large cross-sectional area of core in the inductor be desired, multiple substrates, such as a second substrate 414A with anisotropic magnetic material 450A deposited thereon, may be stacked with substrate 414 and its material 450 to form a layered core as illustrated in FIG. 11.

Figure 12:
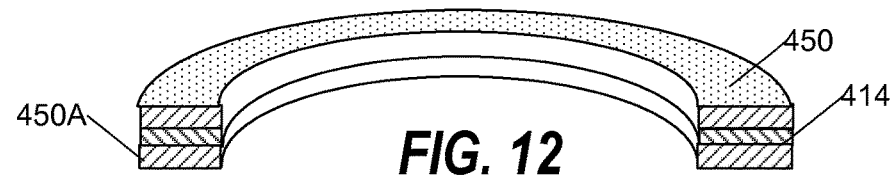
FIG. 12 illustrates a cross-sectional view of a layered magnetic core having two layers of radial-anisotropic magnetic material, the layers disposed on opposite sides of a substrate.

In an embodiment the deposited magnetic material 450, 450A is 20 microns thick, although other thicknesses may be fabricated with the techniques herein described. In a particular embodiment, after deposition of magnetic material 450 on the substrate, the substrate is turned over in the fixture and a second layer of magnetic material 450A deposited thereon forming a core having a single substrate with two layers of magnetic material as illustrated in FIG. 12. In an embodiment, 500-micron-thick polyimide substrates have been used with 6-micron thick layers of magnetic material deposited thereon.

In an alternative embodiment, in order to prevent warping of forming cores due to such factors as thermal expansion mismatch of substrate and deposited material, deposition is done in a sequence of steps. In a first step, a first thickness of magnetic material is deposited on a first side of the substrate, the substrate is flipped over and a second thickness of magnetic material is deposited on a second side of the substrate. The substrate is then flipped over again and a third thickness of magnetic material is deposited atop the first thickness of magnetic material on the first side of the substrate. In a particular embodiment the first and third thickness are equal, and the second thickness is equal to the sum of the first and third thickness. In yet another alternative embodiment, the substrate may be flipped over yet again for a fourth thickness on the second side, the first and fourth thicknesses are approximately equal, and the second and third thicknesses are approximately twice the first and fourth thicknesses.

In another embodiment, an 8.9 nanohenry inductor was wound using 50-micron thick copper windings on a core formed from 50-micron-thick silicon substrates have been used with one or two 20-micron layers of magnetic material deposited thereon.

Figure 13:
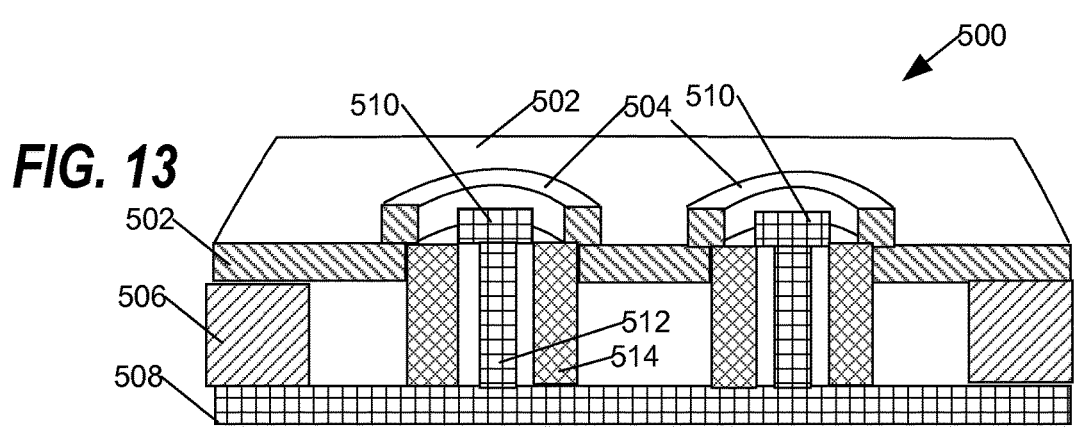
FIG. 13 illustrates schematically a cross-sectional view of an alternative fixture for forming multiple small radially-aniosotropic cores while sharing one or more common magnets among the cores.

In another embodiment, suitable for forming small magnetic cores, a fixture 500 as illustrated in cross section in FIG. 13 is used, wherein common sheet magnets 506 between an upper magnetic plate 502 and a lower magnetic plate 508 are effectively shared between multiple spindles 510 and surrounding magnetic rings 504. Magnetic rings 504 are formed as projections of upper magnetic plate 502. Spindles 510 are in contact with, and may be formed as part of, magnetic pins 512, which are in contact with, and may be formed as projections of, lower magnetic plate 508. In a particular embodiment, spindles 510, lower plate 508, and upper plate 502, are all formed of soft iron. In an embodiment, copper or other thermally conductive and nonmagnetic, cylinders 514 are place around magnetic pins 512 for supporting substrates such that the substrates are properly positioned between spindles 510 and rings 504 during deposition of magnetic core material on the substrates.

The fixture of FIG. 13 may prove simpler than that of FIG. 6 when used for simultaneous formation of large numbers of small toroidal cores. In alternative embodiments, cylinders 514 are replaced by a thermally conductive plate having holes drilled for pins 512. In another alternative embodiment, rings 504 are level with plate 502. In another embodiment, upper plate 502 is formed by electroplating magnetic material in regions defined by photolithography on a drilled, thermally conductive, nonmagnetic plate that serves in place of support cylinders 514. In alternative embodiments, magnetic upper plate 502 is formed by additive or subtractive photolithographic techniques, or by photo-etching a foil sheet.

The radially anisotropic core herein described may be made of any magnetically anisotropic material suitable for deposition in the fixture herein described. In an embodiment, the core is made by depositing a granular metal-non-metal compound ferromagnetic film such as Co—Zr—O or iron-hafnium-oxide (Fe—Hf—O) in the herein described fixture. In another embodiment, the core is made by depositing a ferromagnetic metal alloy, such as nickel-iron (Ni—Fe), cobalt-nickel-iron (Co—Ni—Fe), or an amorphous metal alloy such as cobalt-zirconium-tantalum (Co—Zr—Ta).

Sputter deposition of magnetic materials has been used with CoZrNb, FeCoBC, FeHfO, CoFeHfO, FeZrO, $Fe_{59}Co20B_{14}N_7$, and FeBN, $CoMgF_2$ and CoZrO, which may be layered with $ZrO_2$ insulator layers; some of these materials may prove amenable to forming radially-anisotropic cores using the herein-described method and fixture. Sputtering has also been widely employed for depositing magnetic alloys with high resistivity including CoHfTaPd thin film, and multilayer $CoZrTa/SiO_2$. Electroplating is useful for deposition of permalloy (often $Ni_{80}Fe_{20}$), $Ni_{45}Fe_{55}$ and NiFeMo, as well as nanocrystaline $Co_{65}Ni_{12}Fe_{23}$, and CoFeP amorphous alloy, these materials may also prove amenable to forming radially-anisotropic cores using the herein described fixture and method.

Magnetic materials typically have a transition temperature above which they lose pre-existing magnetic orientation and anisotropy, above this temperature these magnetic materials will orient to an applied magnetic field. It has been observed that some thin-film magnetic materials have low transition temperatures, some as low as in the 100 to 200 degree Celsius range, while many permanent magnet materials have transition temperatures considerably higher. A particular embodiment having transition temperature of 150 C has already been tested. For purposes of this document, a low transition temperature is one less than a transition temperature of magnets in a particular selected fixture. Cobalt-samarium permanent magnets have a transition temperature in the 350 to 500 degree Celsius range, allowing a reasonable temperature margin between an annealing temperature for a wide range of low transition temperature thin-film materials and transition temperature of available permanent magnets for constructing fixtures.

Figure 14:
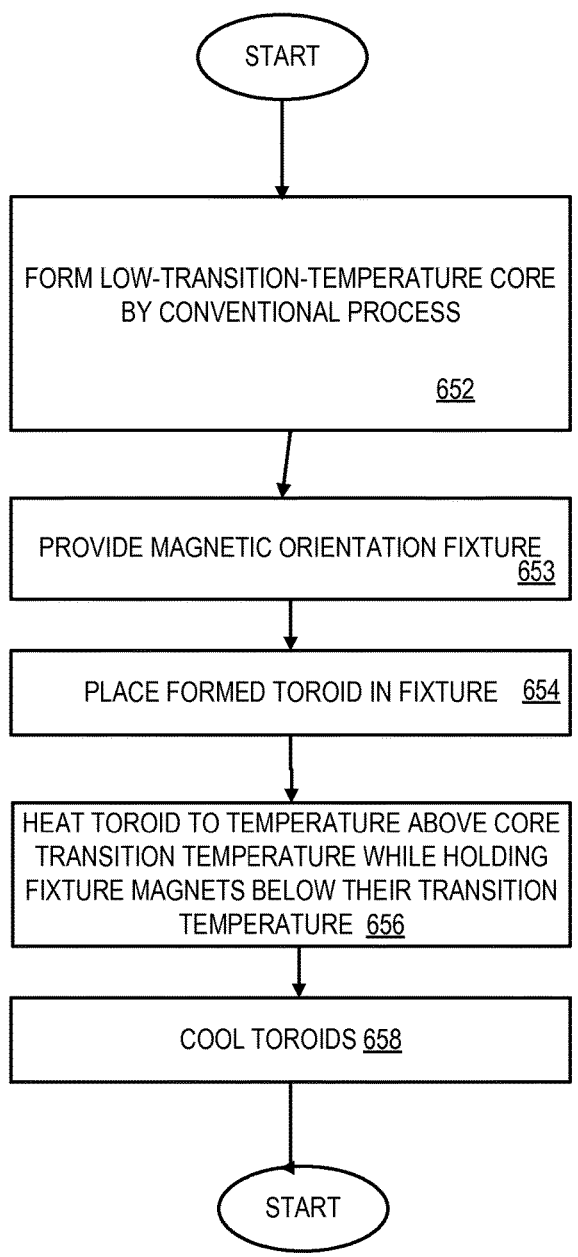
FIG. 14 is a flowchart of an alternative method of forming radially anisotropic cores by annealing formed cores in a fixture resembling that of FIG. 3, 4, 6, 7, 8, 9, or 13.

An alternative method 650 of forming a radially-anisotropic toroidal core is illustrated in FIG. 14. In this method, a thin-film magnetic core is formed 652 of a low-transition-temperature magnetic material by conventional methods. In one process for forming such cores, core material is deposited on one or both sides of a sheet of substrate material, and individual toroids are cut or punched from the sheet. In another processes, toroidal substrates are formed, placed in deposition apparatus without a magnetic orientation fixture, and the low-transition-temperature magnetic material is deposited on the substrates. In some processes, the substrates may be flipped to enable deposition on both sides of the substrates.

A magnetic orientation fixture is provided 653. Once the toroidal cores are formed 652, they are placed 654 in a magnetic orientation fixture as heretofore described with reference to FIG. 3, 4, 6, 7, 8, 9, or 13. In some embodiments, cores fabricated together on the same substrate are separated before their anisotropy is oriented in the fixture, and in other embodiments, such as the fixture described with reference to FIGS. 15 and 16, the fixture is adapted to simultaneously orient anisotropy of multiple cores and the cores may be separated from each other after orientation In some embodiments, the cores are not separated from each other after orientation, but are kept together on one substrate for subsequent fabrication steps to form windings for components such as transformers and inductors and optionally to construct systems from those components.

The cores are then heated 656 to a temperature above their transition temperature, while any permanent magnets of the orientation fixture are kept below their transition temperature. For cores formed of low-transition-temperature materials, this may be done by heating both fixture and cores to a temperature above the core transition temperature and below a higher magnet transition temperature. The material of the cores will then orient with radial anisotropy. The cores are then cooled 658 to lock-in their newly-acquired anisotropy.

Figure 17:
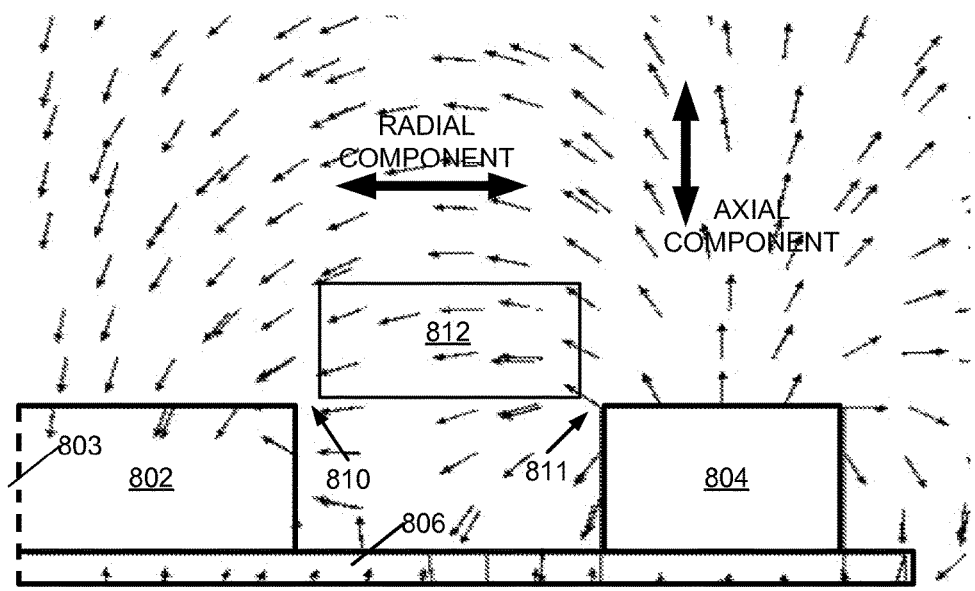
FIG. 17 is a simulation illustrating magnetic field direction between an axial magnet and ring or circumferential magnet provided by a fixture resembling that of FIG. 7A.
Figure 18:
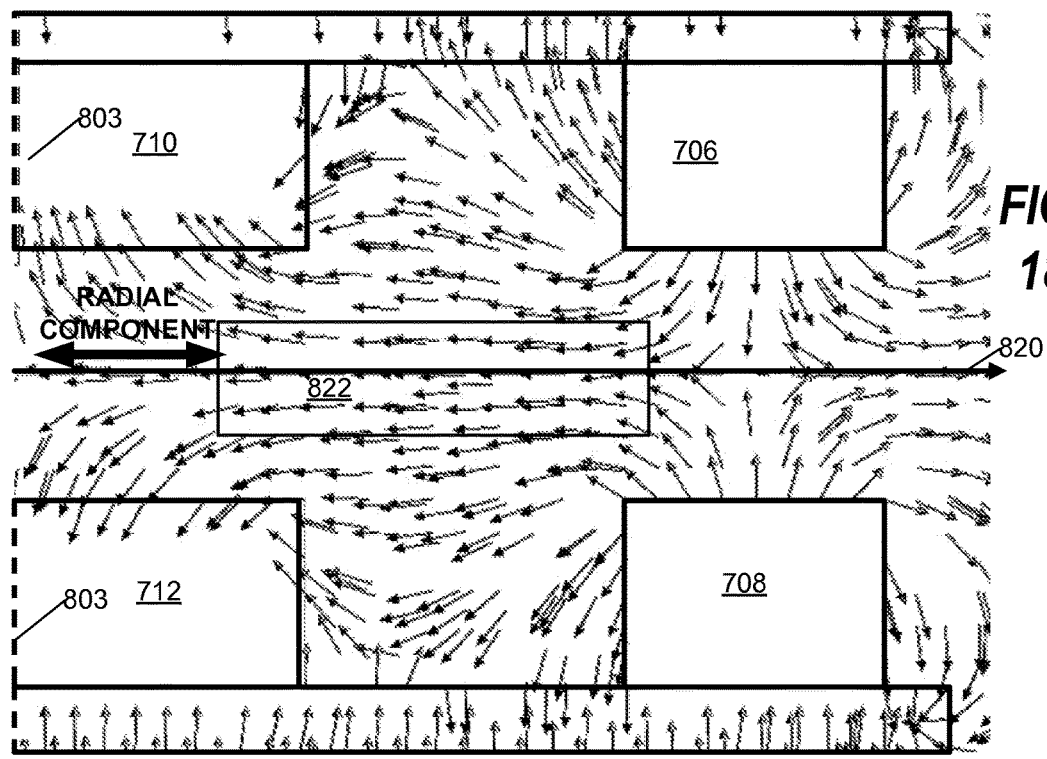
FIG. 18 is a simulation illustrating magnetic field direction between an axial magnet and ring or circumferential magnet provided by a fixture resembling that of FIG. 15.

Simulated directions of magnetic fields between an axially magnetized disk magnet 802 and an axially magnetized ring magnet 804 on an iron plate 806 of a fixture similar to that of FIG. 7A are illustrated in cross section in FIG. 17. It should be noted that FIG. 17 and FIG. 18 illustrate magnetic field directions of only one side of the fixture; only half of each axial disk magnet is shown with the center of the magnet at axis line 803, and only one half of the ring magnet is shown. It is apparent that the field has substantial axial components in much of the volume near the fixture. For applications where a significant axial component to this field is undesirable, it can be reduced in a region near the top of the fixture by providing a T-shaped head 408 on a spindle as heretofore described. Further, the ratio of the axial component to the radial component can be minimized by keeping the cores close to a plane across tops of the magnets, and by providing a gap 810 between an outer circumference of core 812 and an inner circumference of axially magnetized ring magnet 804. Similarly, the ratio of axial component to radial component can also be minimized by providing a gap 811 between an outer circumference of disk magnet 802 and an inner surface of core 812.

Figure 15:
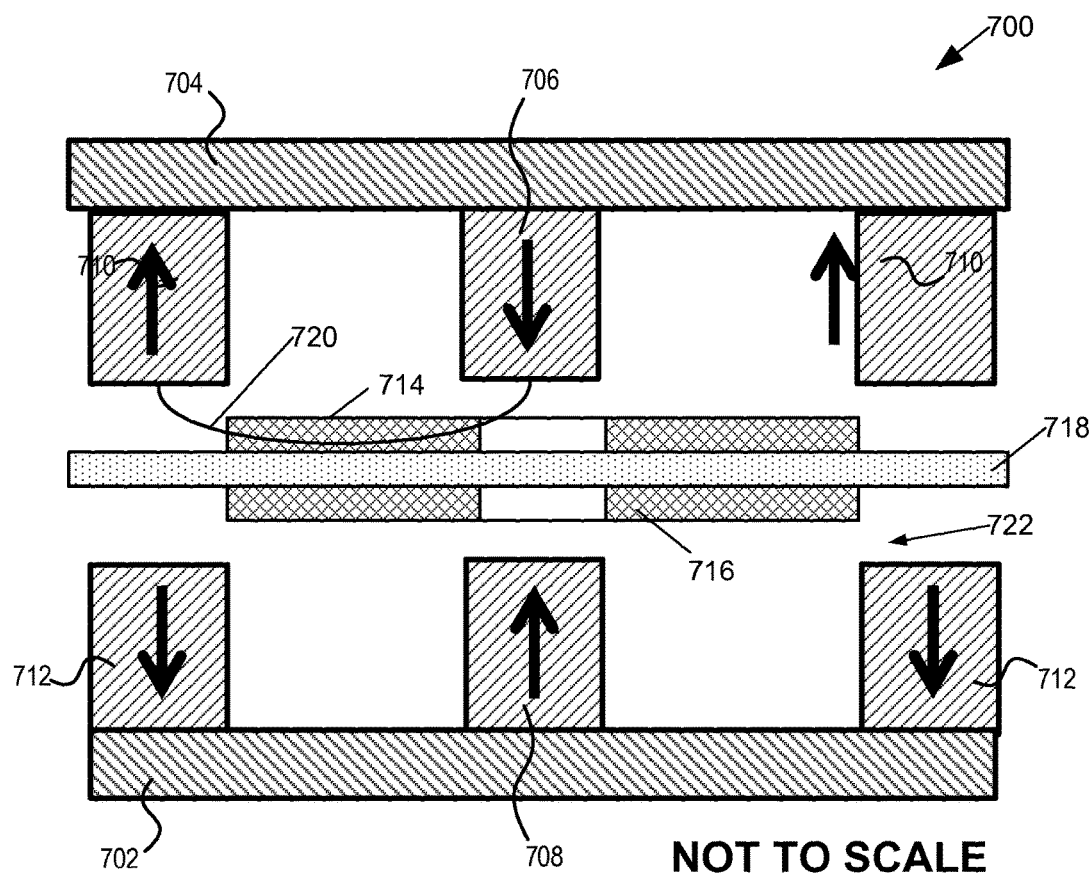
FIG. 15 illustrates a cross-sectional view of an alternative fixture adapted for applying symmetrical radial fields with little axial component to top and bottom surfaces of a toroidal core.

FIG. 15 illustrates an alternative fixture 700 having two, aligned, sets of magnets and adapted to apply radial magnetic fields to a core from both top and bottom simultaneously. In this fixture, two iron plates are provided, a top plate 704 and a bottom plate 700. Adherent to each iron plate 702, 704 are top 710 and bottom 712 axially magnetized disk magnets, and top 706 and bottom 708 axially magnetized ring magnets. In an embodiment, each pair of the axial and circumferential magnets resemble fixtures illustrated in FIG. 7A.

The symmetrical magnetic fields applied by the fixture of FIG. 15 are illustrated by simulation in FIG. 18. The contributions of top and bottom magnet pairs tend to compress the field along a plane 820 of symmetry lying midway between the upper surfaces of bottom magnets 708, 712, and the lower surfaces of upper magnets 706, 710, thereby forming a zone of nearly flat, radially-oriented, magnetic field.

Figure 19:
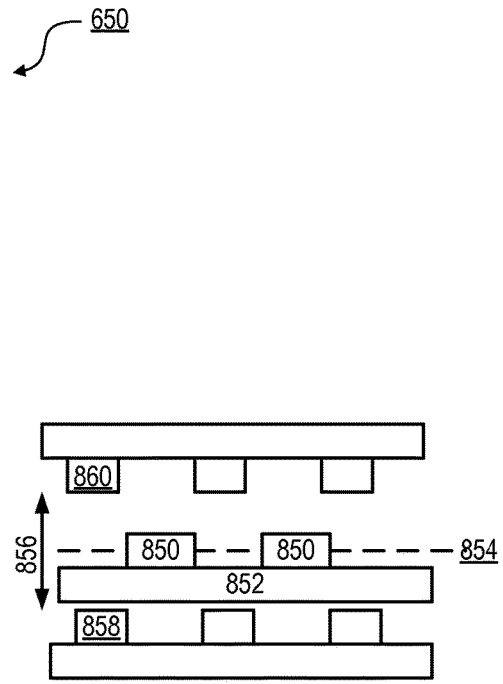
FIG. 19 is an illustration of locating a core for annealing in the zone of primarily radial field along the plane of symmetry between upper and lower halves of the fixture of FIG. 15, 16, or 18.

It has been observed that magnetic fields (represented by field lines 720) of the embodiment of FIG. 15, and as illustrated by field direction arrows in FIG. 18, between axial magnets 706 and circumferential magnets 710 have an axial component—a component that is not purely radial—that is significant near poles of the magnet, although it is zero exactly along the plane of symmetry 820. Positions closer to the plane of symmetry have a more ideal radial field than positions near the poles of the magnet do. The vertical size of the region of predominantly radial field (the region in which the radial field component is much greater than the axial field component) is increased if the spacing between the upper magnet poles and the lower magnet poles is increased. In the case of a thin film on one side of a substrate, the vertical size of the region with predominantly radial field only needs to be as thick as the thin film, and the spacing between the upper and lower magnet poles may be small (unless spacing is desired for other reasons such as flow of an electroplating solution to the surface of the substrate). In the case of thicker films, laminated cores where overall core thickness is significant, or substrates having magnetic core materials deposited on both sides, it may be desirable to have the distance between the upper and lower poles significantly greater than the region in which the core is placed, in order to have a predominantly radial field in that region. Regardless of the distance between the magnet poles or the vertical dimension of the region in which a predominantly radial field is needed, it is desirable to space the substrate such that the magnetic material to be treated is as close as possible to the plane of symmetry 820. For example, for a thin-film of magnetic material 850 on a single side of a thicker substrate 852, the film should be centered on the plane of symmetry 854, while the substrate is displaced from the plane of symmetry as illustrated in FIG. 19. In an embodiment, the spacing 856 between poles 858, 860 is approximately twice the thickness of the substrate, such that placing the substrate directly against the lower poles results in the film on one surface of the substrate being at the plane of symmetry 820, 854.

In an embodiment, toroidal cores are formed by depositing aligned rings of an anisotropic magnetic material 714, 716 having a lower transition temperature than that of magnets 706-712 on one or both of the top and bottom surfaces of a substrate 718, or by depositing magnetic material on the substrate and defining rings by etching; the substrate is then placed between top band bottom axial and circumferential magnets 706, 708, 710, 712 and radial anisotropy is induced in the toroidal cores by annealing as discussed with reference to FIG. 14; the cores are then subjected to further processing to make an end product, which may include separating them, applying inductor windings, or the like. In an alternative embodiment, toroidal cores are formed and positioned between magnets 706-712 without a substrate by nonmagnetic positioning rings (not shown).

In an alternative embodiment, holes (not shown) may be provided in plates 702, 704 to permit an electroplating solution to pass through plates 702, 704 without disrupting the magnetic fields. In this embodiment, the plates and magnets are positioned on each side of the substrate, and cores are formed between the magnets by electroplating magnetic material on the substrate in the magnetic fields provided by the magnets, and radial anisotropy is induced in the cores as they are formed. Alternatively, the electroplating solution may flow through gap 722.

Figure 16:
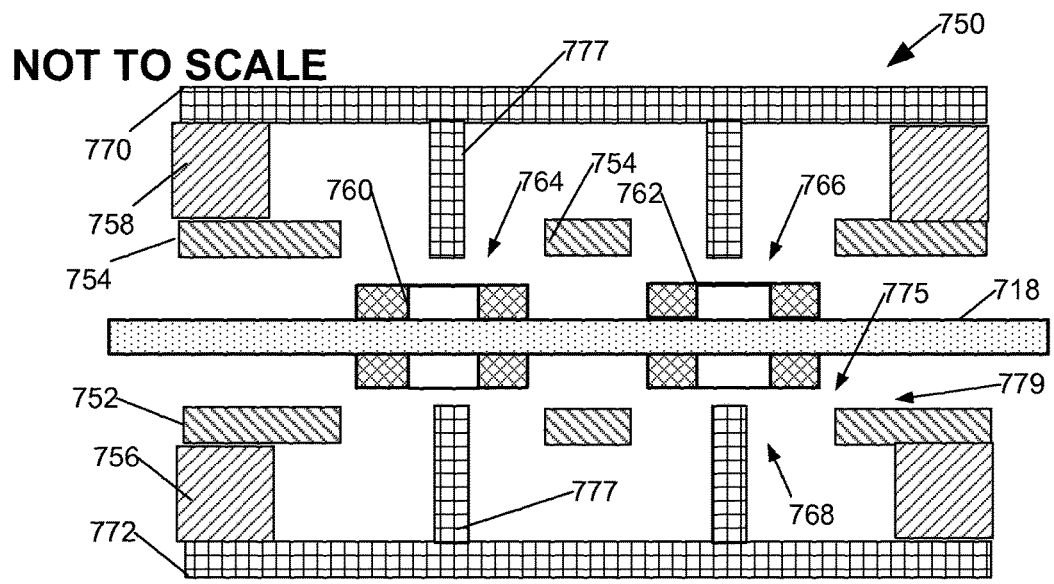
FIG. 16. Illustrates a cross-sectional view of an alternative fixture for applying radial magnetic fields to align small radially-anisotropic cores while sharing common magnets among the cores.

Another embodiment 750 is illustrated in cross section in FIG. 16. In this embodiment, bottom inner plate 752 and upper inner plate 754 convey magnetic flux from bottom common magnet 756 and upper common magnet 758 to cores 760, 762 positioned along the centerline between the upper and lower halves of the fixture. A top outer plate 770 and bottom outer plate 772 also convey magnetic fields from magnets 756, 758 to cores 760, 762. Fields are directed from outer plate 770 772 to cores 760, 762 by pins 777. As with the embodiment of FIG. 15, the cores may be on a substrate 779 or separately positioned by a nonmagnetic guide plate. The embodiment 750 of FIG. 16 benefits from a wide zone of mostly radial magnetic field at a plane of symmetry midway between the inner plates in a manner similar to the embodiment of FIG. 15 and FIG. 18. In some specific embodiments, the space between inner and outer plates and pins 777 may be filled with nonmagnetic material. This embodiment is particularly suited for applying radial magnetic fields during annealing of previously formed cores such that the cores develop radial anisotropy or for electroplating.

In order to enlarge the region of flat fields near the plane of symmetry and provide access to this region, a gap 722 may be provided between a plane designated by inner surfaces of upper inner plates and inner surfaces of the lower inner plates. It should be noted that FIGS. 15 and 16 are schematic figures not drawn to scale, and many thin-film cores and substrates will be much thinner than illustrated, and in particular will be much thinner than the distance from upper to lower inner plate, or the distance from upper magnets to lower magnets.

In the embodiments of FIGS. 15, 16, and 18, a zone 822 of primarily flat, radial, magnetic fields exists along and near the plane of symmetry 820, and this zone 822 is larger than a corresponding zone of near-flat fields in the embodiments of FIGS. 7A and 17, thereby permitting production of larger cores with less axial anisotropic component than obtainable with the embodiment of FIG. 7A.

The term "iron plate" as used herein indicates a plate of soft iron, mild steel, ferrite, or similar material of high magnetic permeability that conveys and guides magnetic fields, without becoming permanently magnetized itself.

Combinations

The elements herein described may be present in various combinations in both the apparatus and the method. A number of the combinations anticipated by the inventors are described as follows.

A method designated A of fabricating a core having a radial aniosotropy, the method comprising providing an apparatus comprising a first magnet for providing a radial magnetic field extending from an axial spindle of the apparatus to a surrounding second magnetic element, the axial spindle and the surrounding second magnetic element defining a cavity therebetween, placing a substrate in the cavity, the substrate having a hole, the hole in the substrate fitting around the head of the spindle; and sputter-depositing a film of ferromagnetic material onto the substrate.

A method designated AA including the method designated A wherein the apparatus for providing a radial magnetic field includes the spindle formed of magnetic material, the spindle being magnetically coupled to a first pole of the first magnet, the spindle having a head opposite the first magnet, the head having a diameter greater than a diameter of an intermediate section of the spindle disposed between the magnet and the head; and wherein the second magnetic element is coupled to a second pole of the first magnet; and a conductive, nonmagnetic, insert disposed between the intermediate section of the spindle and the second magnetic element.

A method designated AB including the method designated A wherein the apparatus for providing a radial magnetic field has the spindle formed of magnetic material, the spindle being magnetically coupled to a first pole of the first magnet, the spindle having a head opposite the first magnet, the head having a diameter greater than a diameter of an intermediate section of the spindle disposed between the magnet and the head, a second magnet magnetically coupled to a second pole of the first magnet, and wherein the second magnetic element is coupled to a second pole of the second magnet.

A method designated AC including the method designated AB wherein the first magnet is coupled to the second magnet by a magnetic plate.

A method designated AD including the method designated AC wherein the magnetic plate is an iron or mild steel plate.

A method designated AE including the method designated A, AA, AB, AC, or AD wherein the apparatus for providing a radial magnetic field has the spindle formed of magnetic material, the spindle being magnetically coupled to a first pole of the first magnet, the spindle having a head opposite the first magnet, the head having a diameter greater than a diameter of an intermediate section of the spindle disposed between the magnet and the head, a second magnet magnetically coupled to a second pole of the first magnet, and wherein the second magnetic element is coupled to a second pole of the second magnet.

A method designated AF including the method designated A, AA, AB, AC, AD, or AE where the film of ferromagnetic material comprises a ferromagnetic metal-nonmetal granular material.

A method designated AG including the method designated AF where the film of ferromagnetic material comprises cobalt-zirconium-oxide (Co—Zr—O).

A method designated AH including the method of designated A, AA, AB, AC, AD, or AE where the film of ferromagnetic material comprises a crystalline metal film.

A method designated AH including the method designated A, AA, AB, AC, AD, or AE wherein the film of ferromagnetic material comprises an amorphous metal film.

In embodiments of the methods designated A-AH, the core is made of a ferromagnetic material selected from the group designated M, the group designated M consisting of Co—Zr—O, Fe—Hf—O, Ni—Fe, Co—Ni—Fe, Co—Zr—Ta CoZrNb, FeCoBC, FeHfO, CoFeHfO, FeZrO, $Fe_{59}Co_{20}B_{14}N_7$, FeBN, $CoMgF_2$, CoZrO, CoHfTaPd, CoZrTa, permalloy, $Ni_{45}Fe_{55}$, NiFeMo, $Co_{65}Ni_{12}Fe_{23}$, Co—Ni—Fe, and CoFeP.

Apparatus designated B for fabricating a core having radial anisotropy comprising a magnetic orientation fixture comprising at least a first magnet for providing a radial magnetic field extending from an axial spindle to a surrounding second magnetic element, the axial spindle and the surrounding second magnetic element defining a cavity therebetween, the cavity configured to receive discoidal substrates, the substrates having an axial hole; and sputter deposition apparatus configured for deposition of films of ferromagnetic material; wherein the magnetic orientation fixture is configured for placement in a reaction chamber of the sputter-deposition apparatus.

Apparatus designated BA including the apparatus designated B wherein the spindle is formed of magnetic material, the spindle being magnetically coupled to a first pole of the first permanent magnet, the spindle having a head opposite the first magnet, the head having a diameter greater than a diameter of an intermediate section of the spindle disposed between the magnet and the head; and wherein the second magnetic element is coupled to a second pole of the first magnet; and a conductive, nonmagnetic, insert disposed between the intermediate section of the spindle and the second magnetic element.

Apparatus designated BB including the apparatus designated B has the spindle formed of magnetic material, the spindle being magnetically coupled to a first pole of the first magnet, the spindle having a head opposite the first magnet, the head having a diameter greater than a diameter of an intermediate section of the spindle disposed between the magnet and the head, a second magnet magnetically coupled to a second pole of the first magnet, and wherein the second magnetic element is coupled to a second pole of the second magnet.

Apparatus designated BC including the apparatus designated B wherein the first magnet is coupled to the second magnet by a magnetic plate.

Apparatus designated BD including the apparatus designated BC wherein the magnetic plate is an iron plate.

Apparatus designated BE including the apparatus designated B, BA, BB, BC, or BD wherein the apparatus for providing a radial magnetic field has the spindle formed of magnetic material, the spindle being magnetically coupled to a first pole of the first magnet, the spindle having a head opposite the first magnet, a second magnet magnetically coupled to a second pole of the first magnet, and wherein the second magnetic element is coupled to a second pole of the second magnet.

Apparatus designated BF including the apparatus designated B, BA, BB, BC, BD or BE where the deposition apparatus is configured to deposit a film of Co—Zr—O.

Apparatus designated BG including the apparatus designated B, BA, BB, BC, BD or BE where the first magnet is an electromagnet.

A method designated BH including the apparatus designated B, BA, BB, BC, BD or BE wherein the film of ferromagnetic material comprises an amorphous metal film.

A method designated BI wherein the deposition apparatus is configured to deposit a material from the group designated M.

A radially anisotropic toroidal magnetic core designated C.

A magnetic core designated CA comprising the radially anisotropic toroidal magnetic core designated C comprising a radially anisotropic film of Co—Zr—O.

A magnetic core designated CB comprising the magnetic core designated C where the film of ferromagnetic material comprises a ferromagnetic nanogranular nonmetallic compound.

A magnetic core designated CC comprising the magnetic core designated C wherein the film of ferromagnetic material comprises an amorphous metal film.

A magnetic core designated CD comprising a material from the group designated M.

An inductor comprising a coil wound on the radially anisotropic core designated C, CA, CB, CC or CD.

A method designated D of fabricating a core having a radial aniosotropy, including fabricating a core of anisotropic material; providing a fixture comprising a first magnet for providing a radial magnetic field extending from an axial spindle of the fixture to a surrounding second magnetic element, a magnetic field extending from the axial spindle to the second magnetic element; placing the core in a region subject to magnetic fields extending from the spindle to the second magnetic element; and heating the core above a transition temperature of the core to cause the anisotropic magnetic material of the core to become radially anisotropic.

A method designated DA including the method designated D where the fixture further comprising a third magnet for providing a radial magnetic field extending from a second axial spindle of the fixture to a surrounding fourth magnetic element, a magnetic field extending from the second axial spindle to the fourth magnetic element; where the third magnet is opposite the first magnet, and the second magnetic element opposite the fourth magnetic element; wherein the core is placed in a region subject to magnetic fields extending from the second spindle to the fourth magnetic element during the step of heating the core.

A method designated DB including the method designated E further comprising simultaneously inducing radial anisotropy into a second core during the step of heating the core, the second core located in a region subject to magnetic fields extending from a fifth and seventh magnetic element to a sixth and eighth magnetic element, the first magnet providing magnetic fields to the fifth and sixth magnetic elements, and the second magnet providing magnetic fields to the seventh and eighth magnetic elements.

A method designated E of fabricating a core having a radial aniosotropy, the method comprising providing a fixture comprising a first magnet for providing a radial magnetic field extending from an axial magnetic element of the fixture to a surrounding second magnetic element; the fixture further comprising at least a second magnet for providing a radial magnetic field extending from a third magnetic element to a surrounding fourth magnetic element; placing a substrate in a region subject to magnetic fields extending from the first and third magnetic elements to the second and fourth magnetic elements; and electroplating core magnetic material onto the substrate to form a radially anisotropic core.

A method designated EA including the method designated E further comprising simultaneously electroplating core magnetic material onto a second core, the second core in a region subject to magnetic fields extending from a fifth and seventh magnetic element to a sixth and eighth magnetic element, the first magnet providing magnetic fields to the fifth and sixth magnetic elements, and the second magnet providing magnetic fields to the seventh and eighth magnetic elements.

Changes may be made in the above methods and systems without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present method and system, which, as a matter of language, might be said to fall therebetween.

What is claimed is:

1. A method of fabricating a core having a radial aniosotropy, the method comprising
   providing an apparatus for providing a radial magnetic field comprising
   a first magnet for providing the magnetic field, the magnetic field extending from an axial spindle of the apparatus to a surrounding second magnetic element,
   placing a substrate in a region subject to magnetic fields extending from the spindle to the second magnetic element; and
   depositing a film of aniosotropic ferromagnetic material onto the substrate;
   wherein the apparatus for providing a radial magnetic field comprises the axial spindle formed of magnetic material, the axial spindle being magnetically coupled to a first pole of the first magnet, the spindle axial having a head opposite the first magnet, the head having a diameter greater than a diameter of an intermediate section of the axial spindle disposed between the magnet and the head; and wherein the second magnetic element is coupled to a second pole of the first magnet; and
   a thermally conductive, nonmagnetic, insert disposed between the intermediate section of the axial spindle and the second magnetic element.

2. The method of claim 1 where the film of aniosotropic ferromagnetic material comprises a ferromagnetic nano-granular material.

3. The method of claim 2 wherein the nano-granular material is Cobalt-Zirconium-Oxide (Co—Zr—O).

4. The method of claim 1 where the film of aniosotropic ferromagnetic material comprises a ferromagnetic metal alloy.

5. The method of claim 4 wherein the ferromagnetic metal alloy comprises primarily nickel-iron.

6. The method of claim 4 wherein the ferromagnetic material comprises a magnetic material selected from the group consisting of Co—Zr—O, Fe—Hf—O, Ni—Fe, Co—Zr—Ta CoZrNb, FeCoBC, FeHfO, CoFeHfO, FeZrO, $Fe_{59}Co_{20}B_{14}N_7$, FeBN, $CoMgF_2$, CoZrO, CoHfTaPd, CoZrTa, permalloy, $Ni_{45}Fe_{55}$, NiFeMo, $Co_{65}Ni_{12}Fe_{23}$, and CoFeP.

7. The method of claim 1 where the first magnet is a permanent magnet.

8. The method of claim 1 wherein the first magnet is an electromagnet.

9. The method of claim 1 wherein the film of aniosotropic ferromagnetic material comprises an amorphous metal alloy film.

10. The method of claim 1 wherein the substrate is non-ferromagnetic.

* * * * *